(12) United States Patent
Nuttinck et al.

(10) Patent No.: US 8,183,894 B2
(45) Date of Patent: May 22, 2012

(54) DEVICE FOR AND A METHOD OF GENERATING SIGNALS

(75) Inventors: Sebastien Nuttinck, Heverlee (NL); Tony Vanhoucke, Bierbeek (BE); Godefridus Hurkx, Best (NL)

(73) Assignee: NXP B.V., Eindhoven (NL)

( * ) Notice: Subject to any disclaimer, the term of this patent is extended or adjusted under 35 U.S.C. 154(b) by 225 days.

(21) Appl. No.: 12/674,735

(22) PCT Filed: Aug. 6, 2008

(86) PCT No.: PCT/IB2008/053158
§ 371 (c)(1),
(2), (4) Date: Feb. 23, 2010

(87) PCT Pub. No.: WO2009/027887
PCT Pub. Date: Mar. 5, 2009

(65) Prior Publication Data
US 2011/0215841 A1    Sep. 8, 2011

(30) Foreign Application Priority Data
Aug. 28, 2007   (EP) .................................. 07115111

(51) Int. Cl.
*H03B 19/00*   (2006.01)

(52) U.S. Cl. ......................... 327/113; 327/420; 327/478

(58) Field of Classification Search .................. 327/113, 327/114, 116, 119, 419–422, 478
See application file for complete search history.

(56) References Cited

U.S. PATENT DOCUMENTS

| 4,611,388 | A |   | 9/1986  | Pande |
|-----------|---|---|---------|-------|
| 5,561,393 | A | * | 10/1996 | Sakurai et al. ............... 327/442 |
| 5,936,284 | A |   | 8/1999  | Ravanelli |
| 2005/0040387 | A1 |  | 2/2005 | Feng et al. |
| 2010/0085105 | A1 | * | 4/2010 | Bayerer et al. ............... 327/419 |

FOREIGN PATENT DOCUMENTS
EP    0534804 A1    3/1993

OTHER PUBLICATIONS

De Angelis, A., et al; "A Low-Cost Ultra-Wideband Indoor Ranging Technique"; Instrumentation and Measurement Technology Conference Proceedings, 2007 IEEE; May 1, 2007; p. 1-6.
"Correspondence"; Proceedings of the IRE; IEEE, Piscataway, NJ, US; vol. 46, No. 7; Jul. 1, 1961; pp. 1204-1231.
Trew, R. J.; "High-Frequency Solid-State Electronic Devices"; IEEE Transactions on Electron Devices; IEEE Service Center, Pisacataway, NJ, US; vol. 52, No. 5; May 1, 2005; pp. 638-649.

(Continued)

*Primary Examiner* — Lincoln Donovan
*Assistant Examiner* — William Hernandez

(57) ABSTRACT

A device (100) for generating an output signal (So) having substantially same or increased output frequency compared to an input frequency of an input signal (Si), the device (100) comprising: a bipolar transistor (102) having a base (B), a collector (C), and an emitter (E); a control unit (104) adapted for controlling application of the input signal (Si) to the base (B) and adapted for controlling application of a collector-emitter voltage between the collector (C) and the emitter (E) in a manner for operating the bipolar transistor (102) in a snap-back regime to obtain a non-linear collector current characteristic to thereby generate the output signal (So) having the substantially same or increased output frequency resulting from a steeply rising collector current.

19 Claims, 4 Drawing Sheets

OTHER PUBLICATIONS

Ahlgren, D.C., et al; "SiGe Heterojunction Bipolar Transistors and Circuits Toward Terahertz Communication Applications"; IEEE Transactions on Microwave Theory and Techniques; IEEE Service Center, Piscataway, NJ, US; vol. 52, No. 10; Oct. 1, 2004; pp. 2390-2408.

Matthias, Rickelt, et al; "A Novel Transistor Model for Simulating Avalanche-Breakdown Effects in Si Bipolar Circuits"; IEEE Journal of Solid-State Circuits; IEEE Service Center, Piscataway, NJ, US; vol. 37, No. 9; Sep. 1, 2002.

Chatterjee, A., et al; "New Physical Insight and Modeling of Second Breakdown (It2) Phenomenon in Advanced ESD Protection Devices"; Electron Devices Meeting 2005; IEDM Technical Digest; Dec. 5, 2005; Piscataway, NJ, US; pp. 195-198.

\* cited by examiner

DEVICE FOR AND A METHOD OF GENERATING SIGNALS

FIELD OF THE INVENTION

The invention relates to a device for generating a signal. Beyond this, the invention relates to a method of generating a signal.

BACKGROUND OF THE INVENTION

A signal having a high frequency (from RF to THz) enables a wide variety of applications, ranging from gigabits/terabits bandwidth communication systems, to molecular analysis, and medical or industrial imaging.

Known semiconductor devices enabling the generation of such signals having a high frequency include a Gunn diode, tunnelling diodes, transit time diodes, transistor (bipolar, FET)-based oscillators, and multiplier based oscillators relying on device non-linearities such as a Schottky diode.

Nevertheless, an upper limit usually associated to semiconductor devices in terms of frequency generation is in the hundreds of GHz. As a consequence, photonic-based devices such as a gas laser, a quantum cascade laser, or photoconduction-based devices are serves in many applications requiring signals having a high frequency.

However, these photonic devices are bulky, require cryogenic temperature, or are not compatible with the ubiquitous silicon semiconductor technologies.

Very recent investigations have reported the emission of a signal having a high frequency (THz) from exotic semiconductor devices and from highly-Boron doped silicon. The first type of devices using exotic semiconductors rely on the use of the new plasma wave theory, however, the maturity of this technology is still in its infancy and has not be demonstrated in silicon. The second, based on B—Si only works at cryogenic temperature that makes its use impractical for widespread commercial applications.

OBJECT AND SUMMARY OF THE INVENTION

It is an object of the invention to provide a system allowing for generating signals having sufficiently high frequencies.

In order to achieve the object defined above, a device for generating signals and a method of generating signals according to the independent claims are provided.

According to an exemplary embodiment of the invention, a device for generating an output signal having an increased output frequency compared to an input frequency of an input signal is provided, the device comprising a bipolar transistor having a base (or base terminal), a collector (or collector terminal), and an emitter (or emitter terminal), and a control unit (which may have processor capabilities) adapted for controlling application of the input signal to the base and adapted for controlling application of a collector-emitter voltage between the collector and the emitter in a manner for operating the bipolar transistor in a snap-back regime to obtain a non-linear collector current characteristic to thereby generate the output signal having the increased output frequency resulting from a steeply rising (particularly in the time domain) collector current (upon application of an oscillating input signal).

According to another exemplary embodiment of the invention, a method of generating an output signal having an increased output frequency compared to an input frequency of an input signal is provided, the method comprising providing a bipolar transistor having a base, a collector, and an emitter, controlling application of the input signal to the base, and controlling application of a collector-emitter voltage between the collector and the emitter in a manner for operating the bipolar transistor in a snap-back regime to obtain a non-linear collector current characteristic to thereby generate the output signal having the increased output frequency resulting from a steeply rising collector current.

Data processing by the control unit for control purposes which may be performed according to embodiments of the invention can be realized by a computer program, that is by software, or by using one or more special electronic optimization circuits, that is in hardware, or in hybrid form, that is by means of software components and hardware components.

In the context of this application, the term "bipolar transistor" (for instance a bipolar junction transistor, BJT, or a heterojunction bipolar transistor, HBT) may particularly denote a type of transistor, an amplifying or switching device, which may be constructed of doped semiconductor. A bipolar transistor may be a sandwich of differently doped sections, such as NPN or PNP. The center section is termed the base ("B") of the transistor. By varying the current between the base and one terminal termed the emitter ("E"), one can vary the current flow between the emitter and a third terminal known as the collector ("C"), causing amplification of the signal at that terminal.

The term "snap-back" may particularly denote an effect which may occur in a bipolar transistor and which may refer to an operation mode of a bipolar transistor in which an exponential description of a collector current is not applicable any more. Particularly, FIG. 8 illustrates a characteristic current-voltage-curve of a bipolar transistor that shows a normal operation mode of a bipolar transistor as well as a snap-back operation mode.

The term "signal" (particularly "output signal") may particularly denote an electric (for instance voltage or current, that is a wire bound transport of charged particles) signal or an electromagnetic signal (such as an electromagnetic wave, that is a wireless transport of photons), which signal is characterized by a specific frequency or frequency distribution. Such a frequency may be used as a carrier signal (that is as an auxiliary signal contributing to the transport of another signal in which the actual information is included) or as a use signal (such as a signal in which information is encoded). Such a signal may also serve as a probe, for instance in the context of spectroscopic or imaging systems. Such a signal may be an analog signal or a digital signal.

According to an exemplary embodiment of the invention, a bipolar transistor is operated at least part of the time in a snap-back operation mode particularly by selecting a collector-emitter voltage sufficiently large and/or by properly designing voltage, resistors, and current values accordingly, so that application of a signal (having an input frequency) to the base of the bipolar transistor results in the generation of a signal (having an increased output frequency) provided at the collector terminal. Thus, such a device may serve for increasing the frequency of a signal, thereby allowing to reach a terahertz regime starting from a gigahertz regime. However, embodiments of the invention may be applied in any desired frequency domain, for instance between RF and THz.

Particularly, according to an exemplary embodiment of the invention, a very high frequency (for instance millimetre wave, terahertz) frequency source may be provided which may be based on the utilization of the snap-back effect in a bipolar transistor in combination with an appropriately dimensioned load and a time varying signal to produce the terahertz or other high frequency signal.

According to an exemplary embodiment of the invention, a method of generating very high signals is provided, the method comprising operating a bipolar transistor in a snap-back regime (where the exponential description of the collector current is not applicable anymore) resulting in a non-linear collector current, applying a varying signal added to a constant signal contribution to the transistor input (base-emitter), and generating the high frequency signal (that is the signal having the high/higher frequency) based on the collector current.

By applying a sequence of input signals each having an input frequency (or a sufficiently narrow frequency distribution), a (quasi-)continuous production of very high frequencies can be achieved, that is to say with a forced repetitive event triggered by the application of the input signals and the biasing of the bipolar transistor terminals. Thus, embodiments of the invention may allow using a bipolar device in a very weird way that can be obtained with simple measures even in silicon technology.

Thus, embodiments of the invention do not have to rely on band diagrams (which limit available frequency values), and therefore do not require complex band engineering. Even direct band gaps are not required for embodiments of the invention. In contrast to this, a bipolar device is operated in a very uncommon way (particularly to repetitively trigger snap-back) to obtain a sharp rise of a transistor signal in the time domain, and consequently high frequency components at the Fourier transformed spectrum in the frequency domain. A device according to an exemplary embodiment of the invention may be denoted as a multiplier, which emits a high frequency signal at an output upon application of a lower frequency signal at an input.

More particularly, a very high frequency source (millimeter waves, terahertz) may be provided based on a standard semiconductor device or small circuit that enables a very high frequency generation by correctly tuning external components. The device may exploit the terminal instability mechanisms of bipolar devices. More particularly, embodiments of the invention use the electrothermal instability mechanism in standard silicon based bipolar devices to generate very high frequency harmonics that can reach well into the mmW wavelength range and into the THZ frequency range. As a consequence, embodiments of the invention may circumvent many problems associated to conventional frequency generators such as incompatibility with silicon technologies, requirement of low temperature operation, low maturity of the technology, or complexity of implementation. In accordance with this, embodiments of the invention enable the generation of very high frequencies in a way compatible with silicon base line process technologies, compatible with room temperature operation (which is important for large volume applications), compatible with mature semiconductor processes, and easy to implement.

For example, an integrated circuit (IC) may be provided which uses electro-thermal instability in bipolar devices, and bases on a proper understanding and modelling of this physical mechanism to be in a situation where harmonics can be generated by operating a transistor in a sophisticate manner. Such a device may comprise a bipolar transistor, a load and a time varying input signal, wherein the tuning or design of parameters of these components may be adjusted to enable the operation of the system in the desired operation mode.

According to a further exemplary embodiment, the device for generating an output signal having substantially same or increased output frequency compared to an input frequency of an input signal comprises a control unit adapted as a feedback loop for controlling application of the input signal, wherein the input signal is derived from the output signal. In other words, an oscillator is provided to make use of the snap-back behaviour to enable an inductor-less single transistor oscillator, preferably in the GHz-range. The fundamentals for an oscillator are available in the snap-back effect where the hysteresis is in the output current-voltage relation. The hysteresis curve may be easily tunable by external resistors.

The feedback loop may comprise a varactor diode in order to make the oscillation frequency electrically tunable.

Next, further exemplary embodiments of the device will be explained. However, these embodiments also apply to the method.

The control unit may be adapted for repeatedly switching the bipolar transistor between the snap-back regime and a normal operation mode (that is an operation mode out of the snap-back regime, in which a bipolar transistor is conventionally operated). By taking this measure, a continuous or quasi-continuous production of adjustable pulses of electromagnetic radiation having a very high frequency may be obtained. Such a repeated application of input signals may be performed using an additional device which is connected or connectable to an input of the high frequency generation device and which provides an input frequency signal, for instance a conventional Gunn diode or any other conventional device of generating frequency signals. Alternatively, circuits like a voltage-controlled-oscillator (VCO) can be implemented.

The output frequency may be at least 100 GHz, particularly at least 1 THz. Thus, the output frequency may lie in the so-called terahertz gap that is conventionally difficult to handle regarding the generation/emission of electromagnetic or electric signals. Embodiments of the invention allow closing the terahertz gap.

The control unit may be adapted for controlling application of the input signal to the base having a constant voltage contribution and an oscillating voltage contribution oscillating with the input frequency. In other words, the input signal to be supplied to the device for the generation of a multiplied frequency may comprise an offset voltage and additionally a contribution varying with time, particularly oscillating in a sinusoidal or cosinusoidal manner. The added time dependent signal may be generated by a conventional pulse or frequency signal generator which provides the system with an input frequency which is further increased by the correspondingly controlled bipolar transistor.

The device may comprise an input signal matching unit adapted for matching the input signal before supply to the base. Such an input signal matching unit may be connected between an input interface of the device at which the input signal is provided, and the base terminal of the bipolar transistor. Such an input matching circuit may operate on its own (that is in a self-sufficient manner) or may be controlled by the control unit to match the raw input signal in a manner that it can be further processed at the base of the transistor. For instance, the input signal matching unit may be capable of impedance matching. The matching procedure may include the adaptation of impedance, voltage, current or amplitude properties, as well as the matching of frequencies.

The device may comprise an output signal receiver unit coupled to the collector and adapted to receive and further use the output signal. In other words, the output signal receiver unit may be an entity that may use the output signal generated by the device as an input signal for its own purposes and which may make practical use of a signal having such a high frequency. By directly connecting the output signal receiver unit to the collector terminal, a short signal path may be achieved and an immediate further processing of the high frequency signal may be performed.

The output signal receiver unit may be an antenna, particularly an emitter antenna adapted for emitting electromagnetic radiation based on the generated output signal received by the antenna. Thus, the signal may be applied to an antenna for the generation of electromagnetic radiation based on an electric signal, so that the electromagnetic radiation can then be emitted by the antenna, for instance for communication purposes. Alternatively, it is also possible that the output signal receiver unit uses the generated signal as an electric signal travelling along a wire.

Other exemplary applications of embodiments of the invention to be supplied with the output system are communication systems (such as wireless communication systems using the output signal for a wired or wireless communication, for instance in the field of telephone networks), imaging systems (for example medical imaging systems for medical applications involving electromagnetic radiation generated by embodiments of the invention, industrial imaging systems such as lithography, security imaging systems such as baggage inspection systems used at airports, molecular analysis systems such as spectroscopic systems), material content monitoring systems (such as analysis systems using the output signal for determining ingredients of a substance like food, agricultural products, explosives, or bio-agents). More generally, embodiments of the invention can be used where high frequencies, particularly in the terahertz regime, are desired. Regarding possible applications of exemplary embodiments of the invention, terahertz wireless communication may be made possible. Regarding medical applications, medical imaging for diagnoses may be performed in the terahertz regime which may allow to substitute or replace harmful X-ray irradiation systems. Furthermore, it is possible to identify elements by their terahertz fingerprint (which may have applications to analyze food, drugs, weapons, explosives, etc.). For example, it is possible to analyse steaks or vegetables to analyze their ingredients.

The device may comprise an output signal matching unit adapted for matching the output signal before supply to the output signal receiver unit. For instance, the output signal matching unit may be capable of impedance matching. In a similar manner as the input signal matching unit, an output signal matching unit may be provided which adapts characteristics or properties of the output signal directly supplied from the collector terminal, before supplying the adapted signal to the connected output signal receiver unit.

An input signal generation unit may be adapted for generating an input signal for delivery to the base of the bipolar transistor. Examples for such an input signal generation unit are Gunn diodes, tunnelling diodes, transit time diodes, transistor based oscillators, multiplier based oscillators, etc. Also photonic devices (such as a gas laser, a quantum cascade laser, or photoconduction-based devices) may be implemented.

The input signal generation unit may be adapted for generating the input signal having an input frequency of less than 100 GHz, for instance having an input frequency of 50 GHz. When a frequency multiplication factor of the bipolar transistor is ten, an input frequency of 50 GHz may be converted into an output frequency of 500 GHz.

The device may be monolithically integrated in a semiconductor substrate. In other words, integrated circuit (IC) technology may be applied for manufacturing the components of the device. Particularly the semiconductor substrate may be a group III-group V semiconductor substrate (such as gallium arsenide) or may be a group IV semiconductor substrate such as silicon or germanium. Particularly, silicon technology may be appropriate for manufacturing the device in a cost-efficient manner.

Embodiments of the invention enable the generation of electromagnetic waves with high frequencies. However, these embodiments do usually not generate the signal in its original form, but multiply a conventionally generated signal (for instance having a frequency of 50 GHz) with an IC device to generate multiple harmonics (for instance tenfold). This may be achieved by specifically tuning a standard bipolar transistor, particularly by adjusting the values of a load transistor ($R_L$) and/or by properly adjusting biasing conditions.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
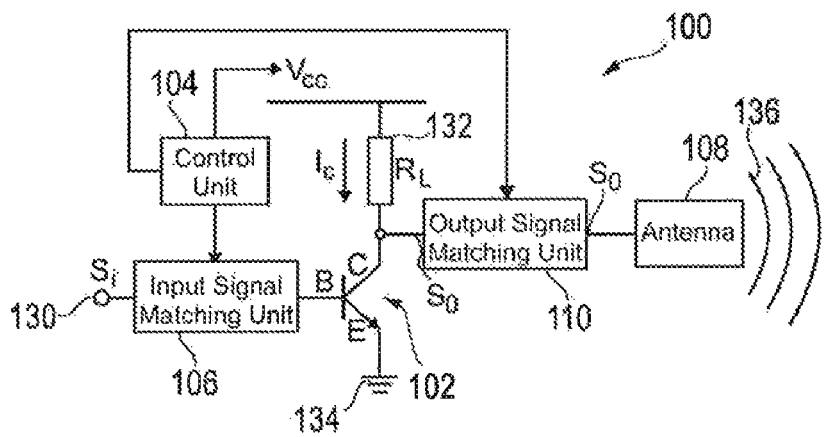
FIG. 1 illustrates a device for generating an output signal having an increased output frequency compared to an input frequency of an input signal according to an exemplary embodiment of the invention.

The illustration in the drawing is schematically. In different drawings, similar or identical elements are provided with the same reference signs.

In the following, referring to FIG. 1, a device 100 for generating an output signal So having an increased output frequency compared to an input frequency of an input signal Si according to an exemplary embodiment of the invention will be explained.

A part or all of the components of the device 100 may be provided as a monolithically integrated semiconductor circuit.

The device 100 comprises a bipolar transistor 102 having a base B, a collector C and an emitter E.

Figure 7:
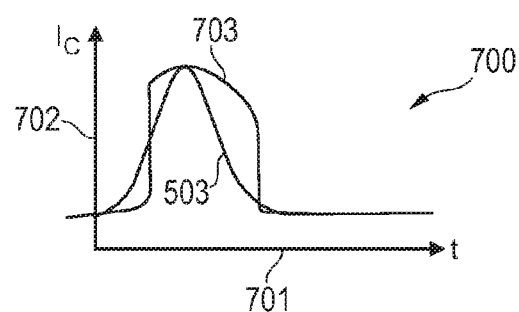
FIG. 7 shows a diagram illustrating a collector current resulting from the input signal with a load line crossing the stability region according to an exemplary embodiment of the invention.

A control unit 104 is provided, which is adapted for controlling application of the input signal Si to the base B and which is adapted for controlling application of a collector-emitter voltage between the collector C and the emitter E in a manner for operating the bipolar transistor 102 in a snap-back regime (see FIG. 8) to obtain a non-linear collector current characteristic to thereby generate the output signal So having the increased output frequency resulting from a steeply rising collector current over time (see FIG. 7).

More particularly, the input signal Si is provided at an input interface 130 of the device 100. The input signal Si can be generated by a signal generation entity that is not shown in FIG. 1 and may have, for instance, a frequency of 50 GHz.

The input signal Si is applied to an input signal matching circuit 106 which is adapted for matching, if desired, properties of the signal Si to the requirements of the base B of the bipolar transistor 102. As can be taken from FIG. 1, the matching circuit 106 may receive instruction commands from the control unit 104 (which instructions may be provided (permanently or updated from time to time) before or during operation of the device 100), so that the control unit 104 indirectly controls application of the signal Si to the base B.

An output of the input signal matching-unit 106 is applied to the base B of the transistor 102. An upper voltage VCC which can be controlled by the control unit 104 or alternatively can be kept constant is applied to a first terminal of a load resistance 132, also denoted as $R_L$, over which a collector current $I_C$ flows. A second terminal of the load transistor 132 is coupled to the collector terminal C of the bipolar transistor 102. An emitter E terminal of the bipolar transistor 102 is coupled to a ground potential 134 (but can alternatively be brought to another electric potential which may be constant or which may vary over time).

After emission of the output signal So which travels along a wire connecting the collector C and an output signal matching unit 110, this output signal is matched by the output signal matching unit 110 to the requirements of an antenna 108 to which the output signal So (for instance in a manipulated form) may then be supplied. As can be taken from FIG. 1, also the output signal matching-unit 110 may be adapted to be controlled by the control unit 104. The antenna 108 may utilize the output signal for the subsequent radiation of electromagnetic radiation (that is a wave) in the terahertz regime, denoted with reference numeral 136.

Figure 8:
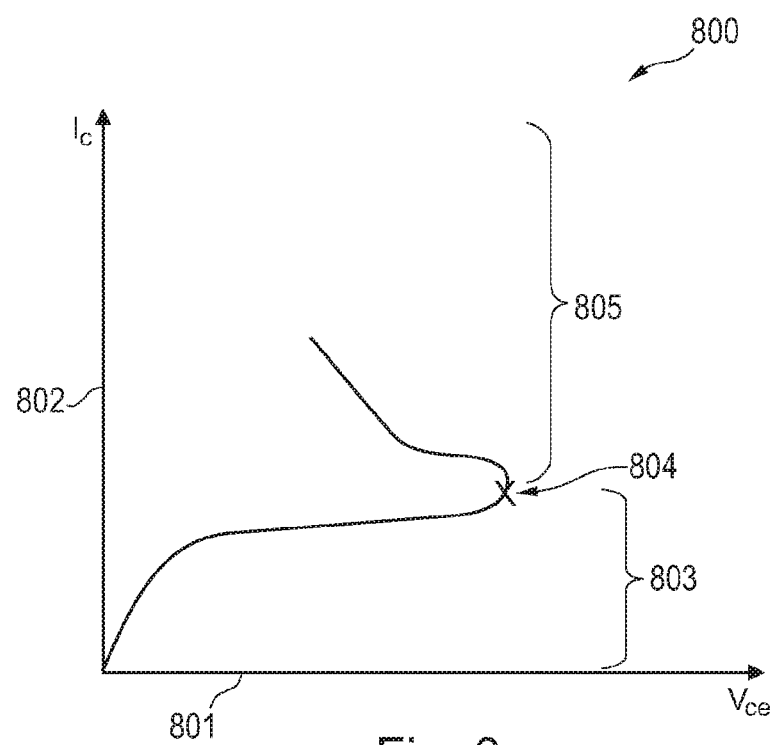
FIG. 8 shows a diagram illustrating a snap-back point of a characteristic curve of a bipolar transistor operated according to an exemplary embodiment of the invention.

The control unit 104 repeatedly switches the bipolar transistor 102 between the snap-back regime and a normal operation mode like shown in FIG. 8. Tuning the different components, the biasing conditions, the voltages, the current values, etc. of the circuit design of the device 100 may perform such a controlling.

By taking this measure, it is for instance possible using an input signal Si having a frequency of 50 GHz to generate an output signal So having a frequency of 500 GHz. The control unit 104, the matching circuits 106, 110, etc. may have processing capabilities, for instance may be manufactured as a central processing unit (CPU) or microprocessor.

In the following, referring to FIG. 2, a device 200 according to another exemplary embodiment of the invention will be explained.

Figure 2:
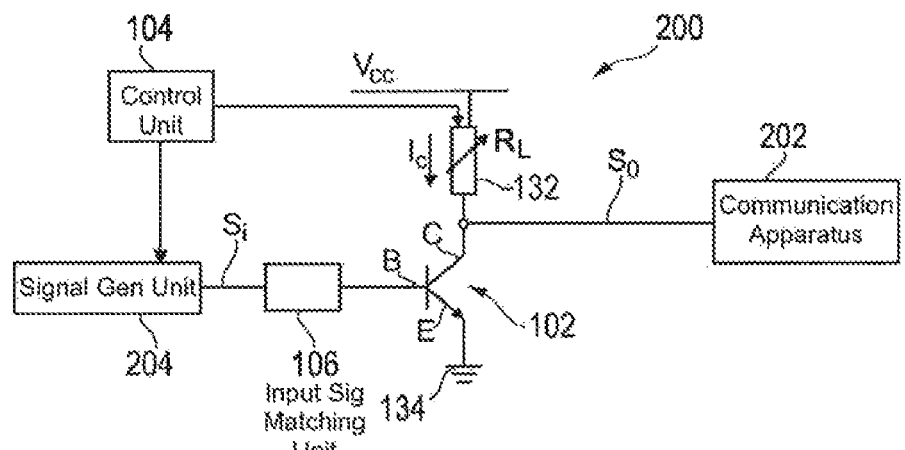
FIG. 2 illustrates another device for generating a signal according to an exemplary embodiment of the invention.

In the embodiment of FIG. 2, a signal generation unit 204 such as a Gunn diode is provided for generating the input signal Si that may have a frequency of 50 GHz.

As an alternative to the embodiment of FIG. 1, the control unit 104 now controls the signal generation unit 204 as well as a controllable resistance 132 having a variable value of the resistance $R_L$, which is provided or defined by the control unit 104. Although not shown in FIG. 2, it is alternatively possible that the control unit 104 additionally controls at least one of the group consisting of VCC, the input matching circuit 106, or the potential 134.

No output matching circuit 110 is foreseen in the embodiment of FIG. 2. The antenna 108 is substituted by a communication apparatus 202 which allows for a wireless communication using the terahertz signal So generated by the device 200.

The usual function of a loaded transistor is illustrated in FIG. 3 to FIG. 6.

Figure 3:
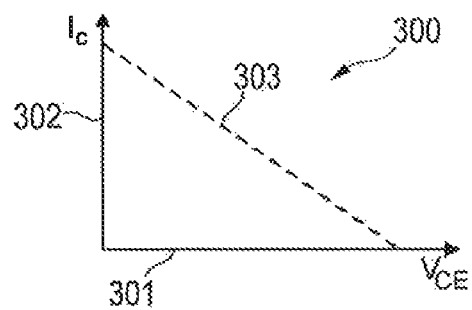
FIG. 3 illustrates a diagram showing the load line of a loaded transistor.

FIG. 3 is a diagram 300 comprising an abscissa 301 along which a collector-emitter voltage $V_{CE}$ is plotted. Along an ordinate 302, a collector current $I_C$ is plotted. A load line 303 is indicated as a characteristic curve of a conventionally operated bipolar transistor. FIG. 3 illustrates the characteristic of a loaded bipolar device, which is a bipolar transistor having a load transistor $R_L$ 132.

Figure 4:
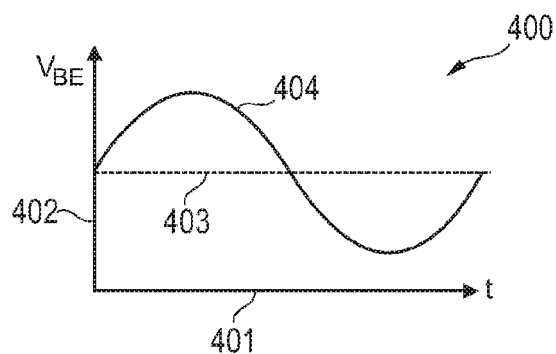
FIG. 4 shows a diagram illustrating a time dependence of an input signal.

FIG. 4 is a diagram 400 having an abscissa 401 along which a time is plotted. Along an ordinate 402, a base-emitter voltage $V_{BE}$ is plotted. The diagram 400 shows a signal 403 which may be applied as an input signal to the bipolar transistor 102 and which has a constant offset contribution 403 and additional the time varying contribution, resulting in addition in an input signal 404.

Figure 5:
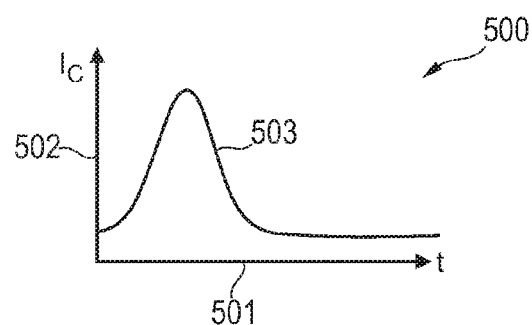
FIG. 5 shows a diagram illustrating a collector current resulting from the input signal of FIG. 4 upon conventional operation of a bipolar transistor.

FIG. 5 shows a diagram 500 having an abscissa 501 along which the time is plotted. Along an ordinate 502, the collector current $I_C$ is plotted. As can be taken from FIG. 5, the collector current conventionally follows a curve 503 having a peak resulting from the application of the input signal shown in FIG. 4.

Thus, the usual function of a conventionally operated bipolar transistor is illustrated in FIG. 3 to FIG. 5. A small signal varying with time is added to the constant offset value 403 which results in the input signal 404 which is applied to the transistor input, as a base-emitter voltage $V_{BE}$. Consequently, since the collector current $I_C$ can be described exponentially in the ideal region, $I_C$ has a shape shown in FIG. 5.

However, at larger current and larger collector-emitter voltage, the transistor goes into the snap-back regime, and the exponential description of the collector current is not applicable any more. Conventionally, this region of operation is not very well described and especially was described most empirically. Thus, any circuit optimization in that region could not be achieved by conventional approaches.

A physical based description of this regime has been recognized which has been developed and validated, enabling accurate simulation and circuit optimization.

Figure 6:
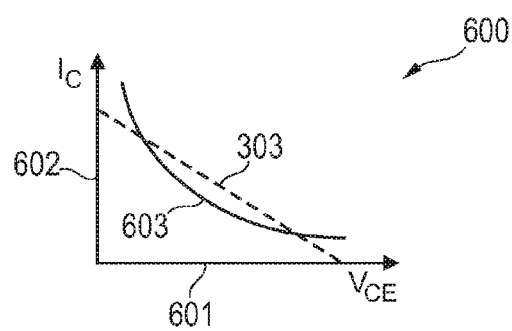
FIG. 6 illustrates a diagram showing the load line of a loaded transistor crossing a stability region calculated and implemented according to an exemplary embodiment of the invention.

By correctively choosing the load resistance $R_L$, in combination with ballast resistance at base and emitter terminals, it is possible to obtain a situation where the load line 303 crosses a critical current line 603 as illustrated in a diagram 600 shown in FIG. 6 which has an abscissa 601 along which a collector-emitter voltage $V_{CE}$ is plotted, and having an ordinate 602 along which the collector current $I_C$ is plotted. Crossing the critical line 603 makes the collector current very non-linear, asymmetrical and highly discontinuous. Such sharp current transitions may lead to the generation of harmonics at orders of magnitude higher than the input frequency and even orders of magnitude higher than the maximum operation frequency of the transistor.

Due to the properly described snap-back effect, the sharpness of the collector current can be established. And since a sharp rise in the time domain corresponds to a high value of the Fourier component in the frequency domain, embodiments of the invention enable the generation of very high frequency harmonics.

FIG. 7 shows a diagram 700 having an abscissa 701 along which the time is plotted. Along an ordinate 702, the collector current $I_C$ is plotted. Apart from the conventional respond curve 503, FIG. 7 shows a snap-back curve 703 that is achieved when the snap-back regime is entered. As can be taken from the curve 703, the collector current has a very steep rising edge that corresponds, in the Fourier transformation spectrum, to very high frequencies up to the terahertz regime and more.

FIG. 8 shows a diagram 800 illustrating a characteristic curve of the collector current $I_C$ plotted along an ordinate 802 and the collector-emitter voltage $V_{CE}$ plotted along an abscissa 801.

At low values of the collector current and low values of the collector-emitter voltage, indicated by a normal operation scheme region 803, the bipolar transistor is operated in a conventional way. At a snap-back point 804, the curve goes back and enters the snap-back region. The snap-back region 805 is an operation mode in which the high frequency generation according to exemplary embodiments of the invention is enabled.

Figure 9:
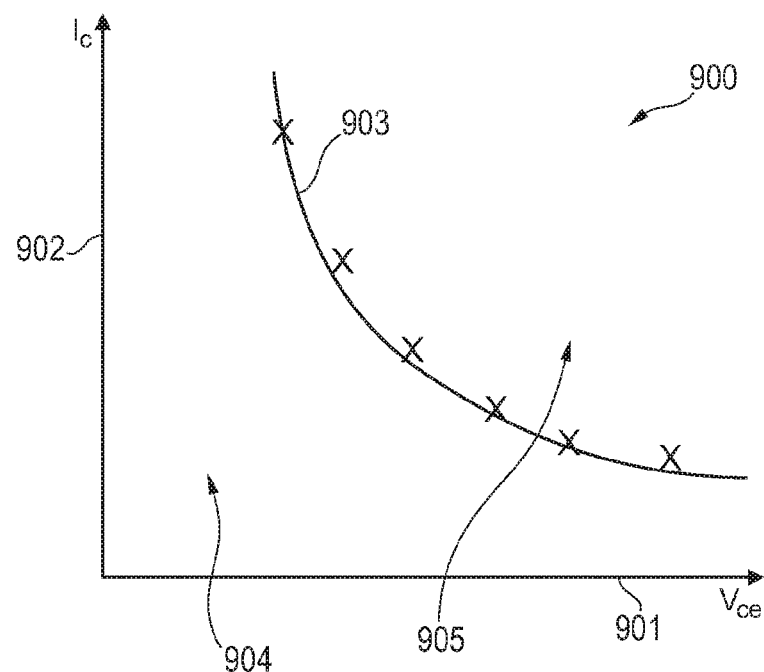
FIG. 9 shows a diagram illustrating a stability line of a bipolar transistor operated in accordance with exemplary embodiments of the invention.

FIG. 9 shows a diagram 900 having an abscissa 901 along which the collector-emitter voltage $V_{CE}$ is plotted. Along an ordinate 902, the collector current $I_C$ is plotted. A curve 903 shows the dependency of the parameters plotted along abscissa 901 and ordinate 902, so that a large base current results in many snap-back points that can be taken from the so-called stability line. A first arrow 904 indicates a normal operation region, whereas an operation region 905 indicates where embodiments of the invention are operated in such a way that high harmonics are generated.

Figure 10:
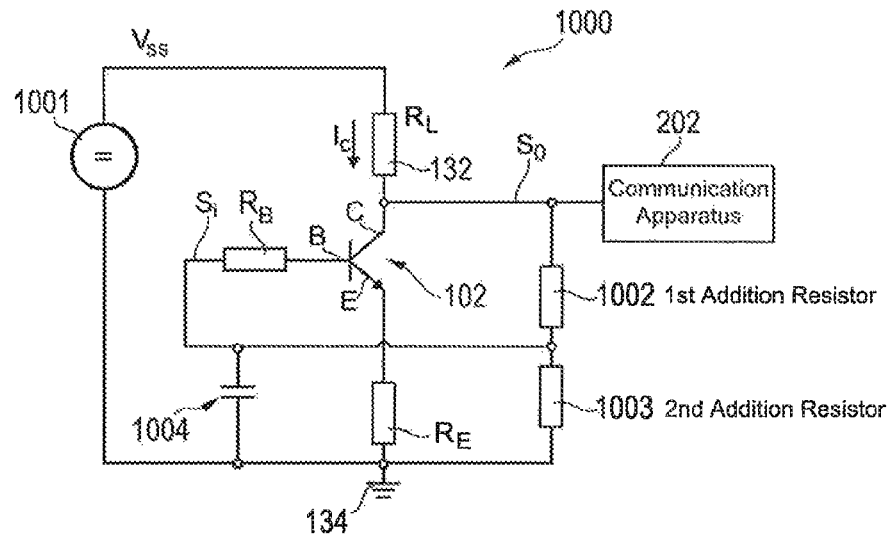
FIG. 10 illustrates an oscillator device according to an exemplary embodiment of the invention.

FIG. 10 shows an oscillator circuit comprising a bipolar transistor 102, a snap-back tuning resistances $R_B$ and $R_E$, a load resistance RL and a voltage source 1001 providing supply voltage Vss. A first addition resistor 1002 and a second addition resistor 1003 are present to make a DC and RF voltage divider needed for the feedback loop. The feedback loop feeds the output signal So back to the input. In other words, the input signal Si is derived the output signal So. Additionally, an oscillator capacitor 1004 has been added between the feedback loop and ground.

In a particular embodiment the oscillator capacity 1004 may be adapted as a varactor diode in order to make the oscillation frequency electrically tunable.

Figure 11:
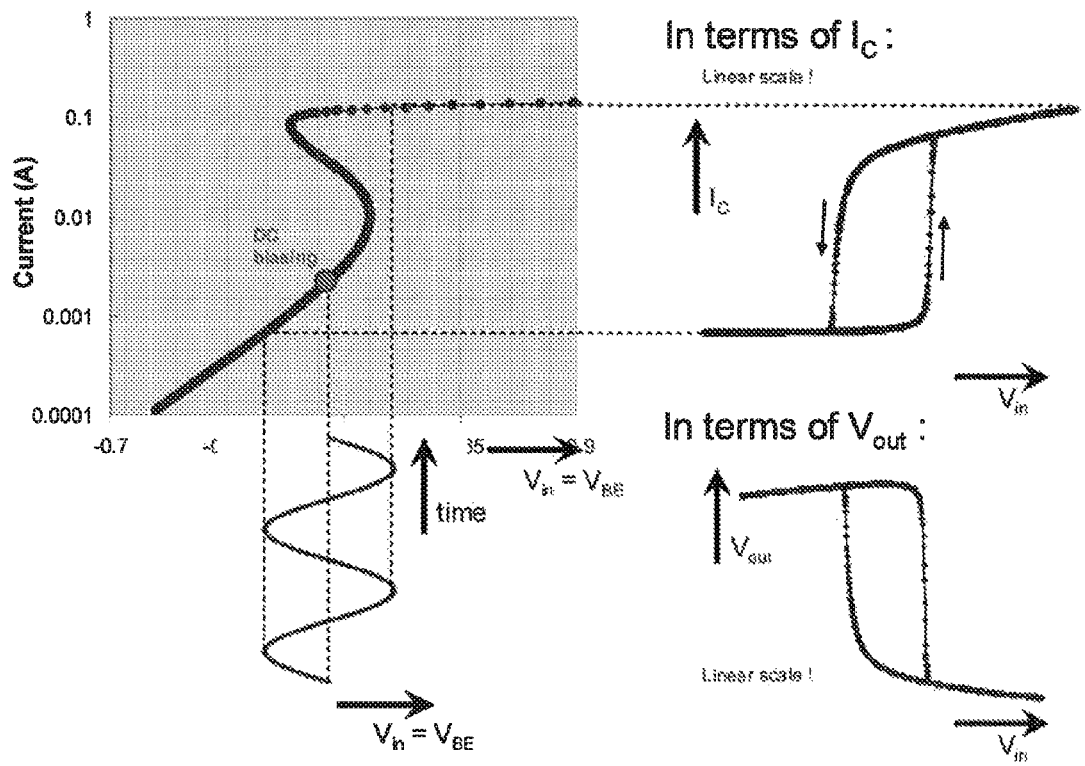
FIG. 11 illustrates the output of an oscillator device according to an exemplary embodiment of the invention.

The trick to use this circuit as an oscillator is to bias the DC and RF voltages such that a hysteresis occurs in the output voltage (see FIG. 11).

As a start, circuit simulations are performed to test the feasibility of the oscillation concept at very low frequencies (20 KHz) taking oscillator capacity $C_{OSC}$=5 µF, RL=10Ω, $R_E$=$R_B$=0, Vss=3.8 V, first addition resistor R1=50Ω and second addition resistor R2=20Ω. These parameter values are sufficient to obtain a stable oscillator behaviour using a BNASHM04x20.7 QUBiC4X transistor. However, any other bipolar transistor is suitable by choosing the correct parameters to tune the snap-back curve. Transient circuit simulations clearly show oscillation behaviour.

When reducing the value $C_{OSC}$ of the external capacitor 1004, the oscillation frequency may be increased. Increasing the oscillation frequency by decreasing the external $C_{OSC}$ value. The ultimate oscillation frequency could be obtained by taking $C_{OSC}$=0 so that only the internal transistor CBE determines the frequency. Periodic Steady-State circuit simulations reveal a stable behaviour of the oscillator. However, for values of $C_{OSC}$ smaller than 12 pF, the oscillator stops since no hysteresis can be found anymore in the collector current. It is believed that this is due to an incorrect modeling of the snap-back region in the circuit simulator. Experimental results, however, have shown that snap-back behaviour can be measured without destroying the transistor. Since no circuit simulations can be performed at very high frequencies, it has been tried to estimate the maximum oscillation frequency. At first order, the maximum oscillation frequency is determined by the internal base-emitter capacitance by the frequency fv. Here the estimation is the maximum oscillation to be between 10-100 GHz for a transistor having a ft=120 GHz.

In a further embodiment, replacing external capacitor 1004 by the internal transistor collector-substrate capacitor Ccs, the oscillation frequency may be tuned by changing the substrate voltage with respect to the collector voltage, i.e. modifying the value of Ccs. The internal collector resistance plays then the role of RL. In case that no external $R_E$ and $R_B$ are needed (i.e. the internal values are high enough to obtain snap-back), only two external resistors are needed for the voltage divider.

In a further embodiment it is possible using the transistor in the oscillator mode while generating higher harmonics in the THz region simultaneously.

It should be noted that the term "comprising" does not exclude other elements or features and the "a" or "an" does not exclude a plurality. Also elements described in association with different embodiments may be combined.

It should also be noted that reference signs in the claims shall not be construed as limiting the scope of the claims.

The invention claimed is:

1. A device for generating an output signal having substantially same or increased output frequency compared to an input frequency of an input signal, the device comprising:
   a bipolar transistor having a base, a collector, and an emitter;
   a control unit adapted for controlling application of the input signal to the base and adapted for controlling application of a collector-emitter voltage between the collector and the emitter in a manner for operating the bipolar transistor in a snap-back regime to obtain a non-linear collector current characteristic to thereby generate the output signal having the substantially same or increased output frequency resulting from a steeply rising collector current.

2. The device according to claim 1, wherein the control unit is adapted for repeatedly switching the bipolar transistor between the snap-back regime and a normal operation mode.

3. The device according to claim 1, wherein the output frequency is at least 100 GHz.

4. The device according to claim 1, wherein the control unit is adapted for controlling application of the input signal to the base, the input signal having a constant voltage contribution and an oscillating voltage contribution oscillating with the input frequency.

5. The device according to claim 1, comprising an input signal matching unit adapted for matching the input signal before supply to the base.

6. The device according to claim 1, comprising an output signal receiver unit electrically coupled to the collector and adapted to receive the output signal.

7. The device according to claim 6, wherein the output signal receiver unit comprises one of the group consisting of an antenna, a communication system, an imaging system, a medical imaging system, an industrial imaging system, a security imaging system, a molecular analysis system, a material content monitoring system, a food monitoring system, an agricultural monitoring system, an explosive monitoring system, and a bio-agent detection system.

8. The device according to claim 6, comprising an output signal matching unit adapted for matching the output signal before supply to the output signal receiver unit.

9. The device according to claim 1, comprising an input signal generation unit adapted for generating the input signal.

10. The device according to claim 9, wherein the input signal generation unit is adapted for generating the input signal having an input frequency of less than 100 GHz.

11. The device according to claim 1, wherein the control unit is adapted as a feedback loop for controlling application of the input signal, wherein the input signal is derived from the output signal.

12. The device according to claim 11, wherein the control unit comprises a tuneable capacitor.

13. The device according to claim 1, is monolithically integrated in a semiconductor substrate.

14. A method of generating an output signal having substantially same or an increased output frequency compared to an input frequency of an input signal, the method comprising providing a bipolar transistor having a base, a collector, and an emitter;

controlling application of the input signal to the base;

controlling application of a collector-emitter voltage between the collector and the emitter in a manner for operating the bipolar transistor in a snap-back regime to obtain a non-linear collector current characteristic to thereby generate the output signal having the substantially same or increased output frequency resulting from a steeply rising collector current.

15. The device according to claim 1, wherein the output frequency is at least 1 THz.

16. The device according to claim 1, wherein the output frequency is in a range between 400 GHz and 100 THz.

17. The device-according to claim 12, wherein the tuneable capacitor is a varactor diode.

18. The device-according to claim 13, wherein the semiconductor substrate is a group IV semiconductor substrate.

19. The device according to claim 18, wherein the group IV semiconductor substrate is a silicon substrate.

* * * * *